(12) United States Patent
Shin

(10) Patent No.: US 7,531,848 B2
(45) Date of Patent: May 12, 2009

(54) LIGHT EMISSION DIODE AND METHOD OF FABRICATING THEREOF

(75) Inventor: Kyoug Ho Shin, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 118 days.

(21) Appl. No.: 11/642,633

(22) Filed: Dec. 21, 2006

(65) Prior Publication Data
US 2007/0145398 A1 Jun. 28, 2007

(30) Foreign Application Priority Data
Dec. 23, 2005 (KR) ...................... 10-2005-0128762

(51) Int. Cl.
*H01L 33/00* (2006.01)
(52) U.S. Cl. .................. 257/100; 257/99; 257/675; 257/676; 257/E33.075
(58) Field of Classification Search ............. 257/676, 257/706, 680, 675, 98, 99, 100, 717, 718, 257/728, E33.058, E33.075, E33.001, E33.066; 438/22, 25, 26, 27, 29
See application file for complete search history.

(56) References Cited

U.S. PATENT DOCUMENTS

| | | | |
|---|---|---|---|
| 2003/0168720 A1* | 9/2003 | Kamada | 257/666 |
| 2003/0189830 A1* | 10/2003 | Sugimoto et al. | 362/294 |
| 2004/0173808 A1* | 9/2004 | Wu | 257/99 |
| 2004/0256630 A1* | 12/2004 | Cao | 257/98 |

* cited by examiner

*Primary Examiner*—Evan Pert
*Assistant Examiner*—Selim Ahmed
(74) *Attorney, Agent, or Firm*—Birch, Stewart, Kolasch & Birch, LLP

(57) ABSTRACT

Provided is a light emission diode package and a fabricating method thereof. The light emission diode package includes a heat sink having a groove, a printed circuit board on the heat sink, a light emission diode on the groove, a reflector coupled to the heat sink, a lead frame included in the reflector and electrically connecting the light emission diode to the printed circuit board and a molding unit on the light emission diode.

20 Claims, 4 Drawing Sheets

LIGHT EMISSION DIODE AND METHOD OF FABRICATING THEREOF

BACKGROUND OF THE INVENTION

1. Field of the Invention

The present invention relates to a light emission diode and a method of fabricating thereof.

2. Description of the Related Art

Light emission diodes (LEDs) are a semiconductor device that can implement multiple colors because the LEDs are used as a light emitting source using compound semiconductor materials such as gallium arsenide (GaAs), aluminium gallium arsenide (AlGaAs), gallium nitride (GaN), indium gallium nitride (InGaN) and aluminium gallium indium phosphide (AlGaInP).

Characteristics of LED device are determined by color, brightness and a range of an amount of light. The characteristics of the LED device are primarily determined by compound semiconductor materials used in the LED device and secondarily influenced by a package structure for mounting a chip.

A primary factor by material development has limits. Therefore, the package structure is concerned in order to obtain high brightness and brightness distribution according to user's demand.

With a tendency toward miniaturization and slim sizing of information communication devices, a variety of device components including a resistor, condenser and a noise filter are more and more miniaturized and made as a surface mount device (SMD) type directly mounted on a printed circuit board (PCB).

Also, an LED lamp used as a display device is made as the SMD type.

The LED lamp of the SMD type can substitute for a related art light lamps and is used as light display device, alphanumeric display devices and image display devices providing multiple colors.

As application fields of LEDs are widened, a required amount of brightness becomes more and more high in electric lights used in everyday life and emergency strobe lights for rescue. Therefore, recently, high power LEDs are widely used.

FIG. 1 is a cross-sectional view of an LED package according to a related art.

Referring to FIG. 1, in the related art LED package, a reflection hole mounting an LED 210 on a PCB 200 is formed and then a reflective coating layer 201 is formed by coating Ag metal in an inside of the hole.

The reflective coating layer 201 is connected to package electrodes 230 and 220 applying a power voltage to the LED 210.

That is, the reflective coating layer 201 formed in the inside of the reflection hole formed on the PCB 200 has an electric disconnected structure at a center region.

The reflective coating layer 201 is formed on the PCB 200 as described above and the LED 210 is mounted on a lower portion of the reflection hole. Also, a p-electrode and n-electrode of the LED 210 are electrically connected on the reflective coating layer 210.

When the LED 210 is mounted as described above, a cathode Electrode 220 and an anode electrode 230 are formed by a solder bonding method on both sides of the reflective coating layer 201.

A filler 231 having similar refractive index to a mold lens 250 provided through subsequent processes is injected into the reflection hole of the PCB 200 where the LED 210 is mounted thereon in order to prevent oxidization of a wire 218, reduce light loss by an air resistance and increase thermal conductivity.

In the LED package fabricated by the above method, light generated from the LED 210 is emitted toward outside through the mold lens 250.

Also, reflective coating layer reflect light emitted from the LED 210 to increase the light efficiency.

However, the LED package having such structure as described above has problems in case of mounting the LED on the PCB, for example, difficulty of processing of the reflection hole having an angle of inclination, difficulty of forming the reflective coating layer using Ag metal and limitation of a depth of the reflection hole by a limited thickness of the PCB.

SUMMARY OF THE INVENTION

Accordingly, the present invention is directed to a light emission diode and a method of fabricating thereof that substantially obviates one or more problems due to limitations and disadvantages of the related art.

The present invention provides a modulated LED package for easily fabricating a package and a method of fabricating thereof when an LED is packaged on a PCB.

The present invention provides an LED package, which can be used as a line light source or a surface light source and a method of fabricating thereof.

The present invention provides an LED package having excellent heat retrieving characteristics and a method of fabricating thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The embodiment of the invention provides a light emission diode package comprising: a heat sink having a groove; a printed circuit board on the heat sink; a light emission diode on the groove; a reflector coupled to the heat sink; a lead frame included in the reflector and electrically connecting the light emission diode to the printed circuit board; and a molding unit on the light emission diode.

The embodiment of the present invention provides a method of fabricating a light emission diode, the method comprising: preparing a heat sink having a groove and a printed circuit board formed on the heat sink; mounting a light emission diode on a base surface of the groove; coupling a reflector where the lead frame is formed to the heat sink; electrically connecting the lead frame to the light emission diode and the printed circuit board; and forming a molding unit on the light emission diode.

The embodiment of the present invention provides a light emission diode package comprising: a heat sink removed a portion thereof to form a groove; a printed circuit board on an upper surface of the heat sink; a light emission diode on a base surface of the groove; a reflector coupled to an upper portion surface of the heat sink and the groove; a lead frame passing through the reflector and electrically connecting the light emission diode to the printed circuit board; and a molding unit on the light emission diode.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
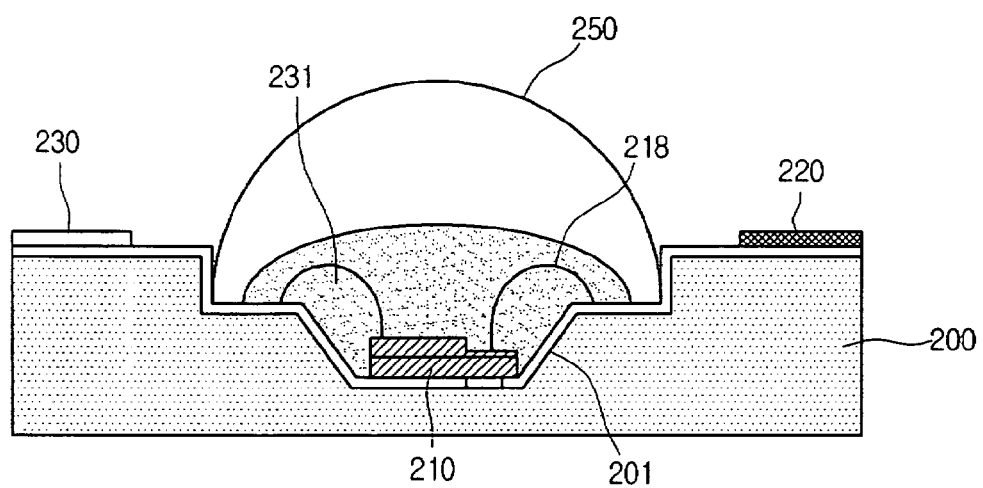
FIG. 1 is a cross-sectional view of an LED package according to a related art.
Figure 2:
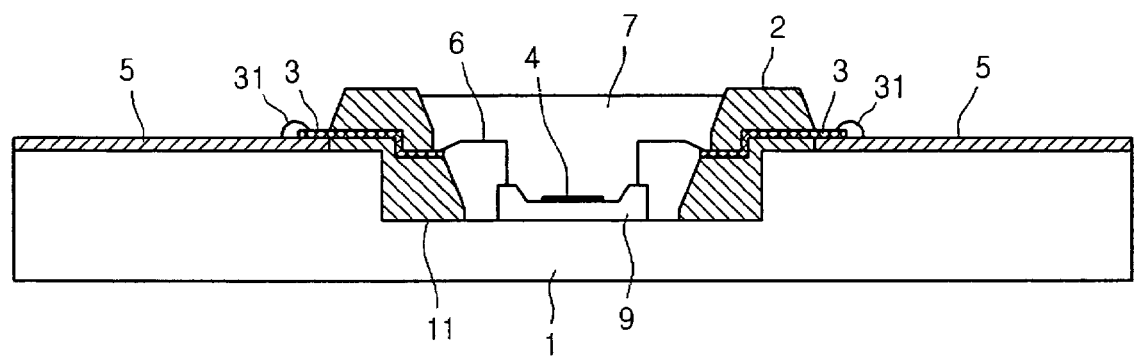
FIG. 2 is a cross-sectional view of an LED package according to an embodiment of the present invention.

FIG. 2 is a cross-sectional view of an LED package according to the present invention.

Referring to FIG. 2, the LED package according to the present invention includes a metallic heat sink 1, a printed circuit board (PCB) 5 formed on the heat sink 1, an LED 4 mounted on the heat sink 1, a lead frame 3 electrically connecting the LED 4 to the PCB 5, a reflector 2 including the lead frame 3 and coupled to the heat sink 1 and a molding unit 7 protecting the LED 4 and injecting materials such as an epoxy and a silicon.

The heat sink 1 is a cooling apparatus of a metallic material, which absorbs heat from an exothermic device and emits the absorbed heat to the outside, the heat sink 1 having a predetermined thickness of about 200 to 400 □.

In an embodiment of the present invention, a groove 11 having a round shape structure is formed in the heat sink 1 and the LED 4 is mounted within the groove 11. Here, the LED 4 is located on a sub mount 9 and mounted within the groove 11.

Figure 6:
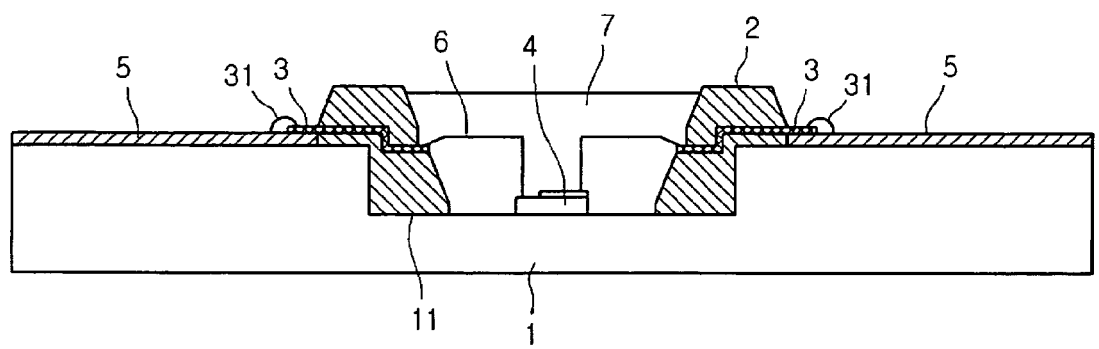

Also, referring to FIG. 6, the LED 4 may be directly mounted within the groove 11 without the sub mount 9. Here, the LED 4 includes all kinds of LEDs such as a SMD type and a lamp type.

Figure 5:
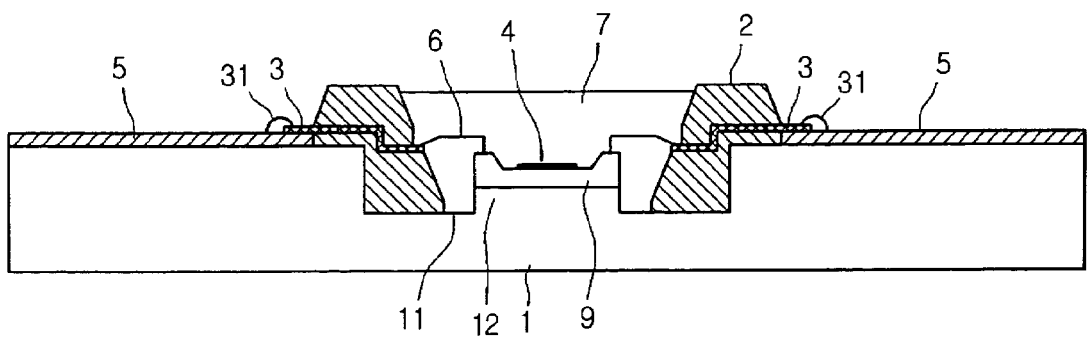
FIGS. 5 through 7 are cross-sectional views of an LED package according to another embodiment of the present invention.
Figure 7:
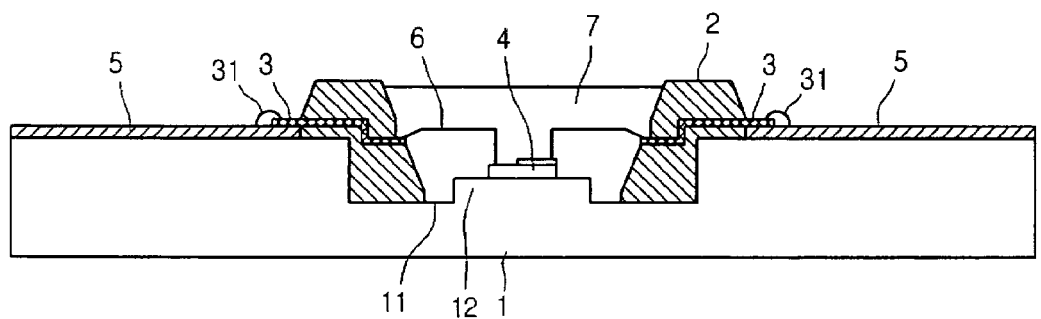

Meanwhile, in another embodiment of the present invention as described in FIG. 5, a groove 11 having a link shape structure is formed in a heat sink 1. That is, a protrusion 12 having a predetermined height is formed in the groove 11 of the heat sink 1 and the LED 4 is mounted on the protrusion 12. Also, referring to FIG. 7, the LED 4 may be directly mounted on the protrusion 12 without the sub mount 9.

The groove 11 formed in the heat sink 1 is formed by at least one process during milling, drilling and chemical etching processes.

A reflector 2 may be formed by extruding plastic materials such as polycarbonate (PC), polycarbonate acrylonitrile, butadiene and styrene (PCABS), polyphthalamide (PPA), nylon, polyethylene terephtalate (PET) and polybutylene terephtalate (PBT) and an formed as a link shape structure having a hole therein.

The reflector 2 is coupled to a groove 8 of the heat sink 1 using paste.

Also, the reflector 2 is vertically or slantly bent at an outside surface such that the heat sink 1 is stably connected. That is, the reflector 2 is contacted with and coupled to an upper side surface of the heat sink 1 and a side surface and a bottom surface of the groove 8 formed on the heat sink 1.

The reflector 2 may be not contacted with the upper side surface of the heat sink 1, but contacted with and coupled to the side surface and the base surface of the groove 8 formed on the heat sink 1.

A metal layer such as stannum (Sn) and argentum (Ag) may be formed on a surface of the reflector 2 in order to improve reflecting efficiency and phthalocyanine may be coated on the metal layer.

Figure 3:
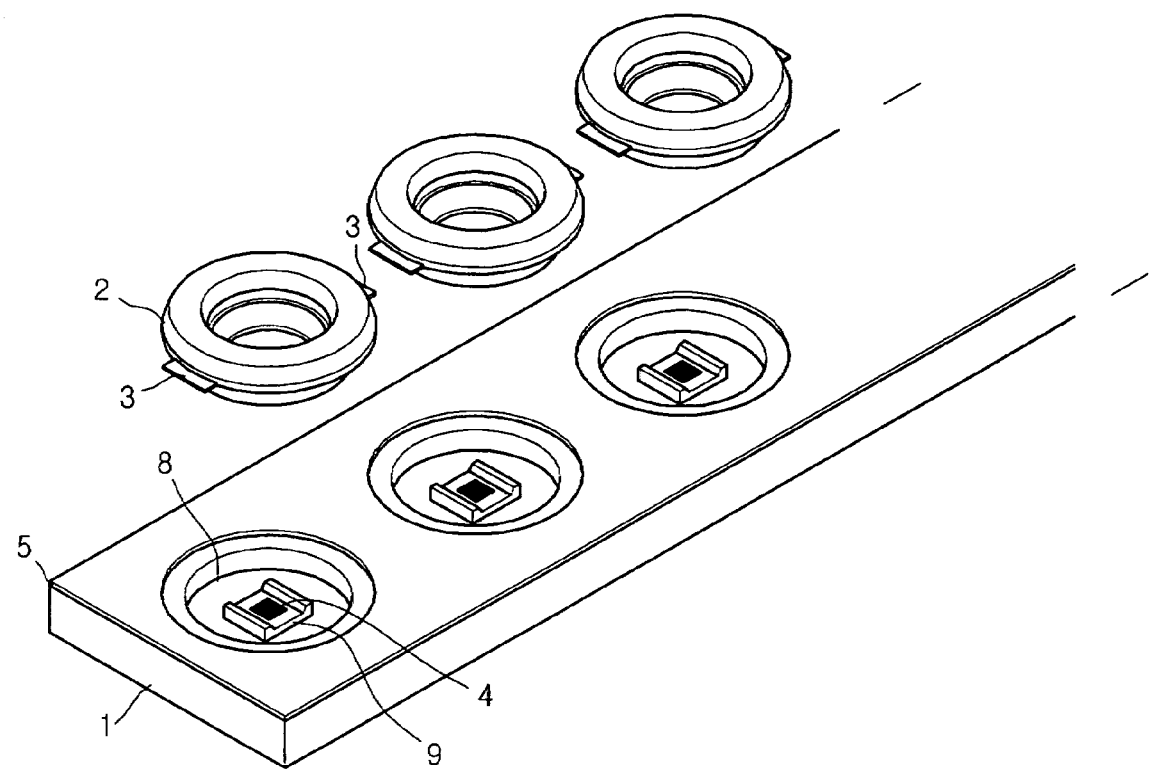
FIG. 3 is a perspective view illustrating coupling of a heat sink and reflector according to the present invention.

Meanwhile, a PCB 5 is not formed on the heat sink 1 where the reflector 2 is coupled. That is, as illustrated in FIG. 3, the PCB may have a plurality of round holes. The heat sink 1 is exposed by the holes and the LED 4 is mounted on the heat sink 1. That is, the LED 4 is separated from the reflector 2.

The reflector 2 is formed in one body with a lead frame 3.

The read frame 3 passes through the reflector 2. Also, the read frame 3 is electrically connected to a wire 6 at an inside of the reflector 2 and electrically connected to the PCB 5 at an outside of the reflector 2. The read frame 3 is separated from the heat sink 1.

Here, the read frame 3 and the PCB 5 can be solidly coupled by a solder 31.

The read frame 3 is protruded toward an outside of the reflector 2 to form a structure, which is adapted to be electrically connected to the PCB 5.

The sub mount 9 is a sub mount made of silicon optical bench (SiOB). The sub mount 9 is flip bonded to have a chip on bonding (COB) structure for electric connection.

In the package structure as described above, the reflector 2 as a module including the lead frame 3 is simply connected using paste on the heat sink 1 as illustrated in FIG. 3.

A hole of an inside of the reflector 2 has a larger diameter at an upper portion than at a lower portion.

Brightness amplification is expected if only the hole of the inside of the reflector 2 having a cylinder shape structure is inserted into a mounting region. Additionally, the hole has a smaller diameter at the lower portion than at the upper portion to increase brightness distribution and an amount of light by adjusting the diameter difference.

Hereinafter, a process of forming an LED package according to the present invention will be described.

Figure 4:
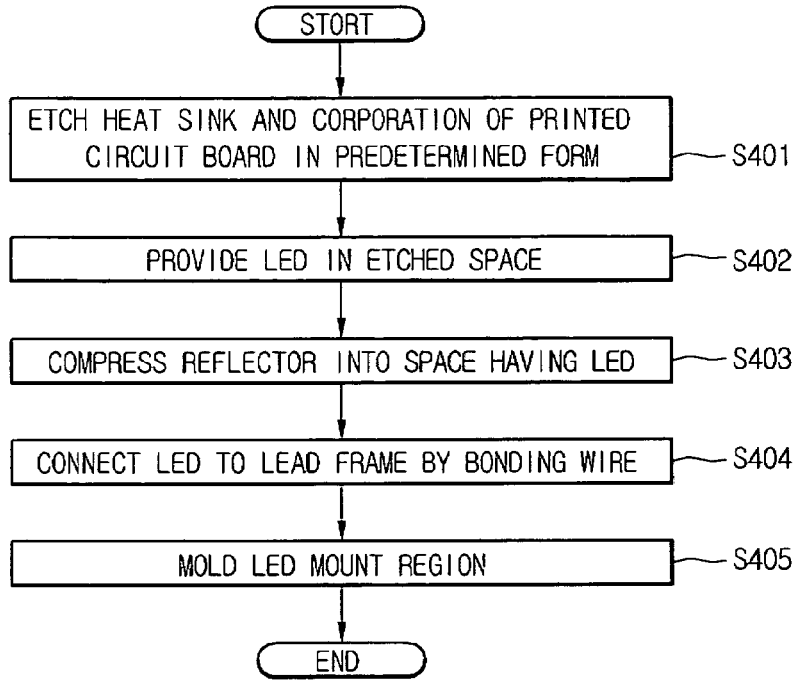
FIG. 4 is a flowchart illustrating a process of forming an LED package according to the present invention.

FIG. 4 is a flowchart illustrating a process of forming an LED package according to the present invention.

A PCB 5 attached using paste is formed on a heat sink 1.

Portions of the heat sink 1 and the PCB 5 are removed to form a groove 11 on the heat sink 1 as illustrated in FIG. 3.

Here, the groove 11 may be formed by a mechanical method such as milling or drilling methods or formed by semiconductor processes such as an etch process and also the groove 11 may have a square shape structure in addition to a round shape structure.

Also, it is possible that a portion of the heat sink 1 is removed after coupling the PCB 5 where a portion is removed with a round shape to form the groove 11.

A sub mount 9 is coupled to the groove 11 of the heat sink 1 using a heat conductive resin for adhesion. In operation 402, an LED 4 is mounted by flip bonding on the sub mount 9. Here, soldering paste is coated on the sub mount 9 in order to bond the LED 4 on the sub mount 9 and then the LED can be bonded.

Also, the LED 4 is firstly bonded on the sub mount 9 and then the sub mount 9 may be coupled to the groove 11 of the heat sink 1.

Next, in operation 403, the reflector 2 is coupled to the groove 11.

After mounting the LED 4 on the sub mount 9, in operation 403, a reflector 2 is coupled to the groove 11. The reflector 2 is attached by coating the paste on a cylindrical surface of inside of the groove 8 in order to couple the reflector 2.

Also, referring to FIG. 2, the reflector 2 is vertically or slantly bent at an outer surface to be coupled in mesh with the heat sink 1.

In operation 404, the LED 4 and the read frame 3 are electrically connected by bonding a wire 6 at the lead frame 3 included in the reflector 2. Here, the LED 4 and the lead frame 3 are electrically connected by bonding the wire 6 and simultaneously a solder 31 is joined in order to electrically connect the lead frame 3 to the PCB 5.

Naturally, the LED 4 may be not only mounted on the sub mount 9 but also directly coupled to the groove 11 of the heat sink 1. In this case, an electrode formed in the LED 4 may be electrically connected with the lead frame 3 formed in the reflector 2 through the wire 6.

Accordingly, a package connected to the wire 6 at the reflector 2 is completed as illustrated in FIG. 2. In such a condition, in operation 405, a molding unit 7 is formed by injecting transparent epoxy or silicon, which also surrounds the LED 4 in a mounting region of the LED 4 and the reflector 2 in order to protect the LED 4 and obtain light-harvesting effect.

A dispersing agent may be added to the molding unit 7 in order to obtain optical characteristics and a phosphor may be injected in order to emit white light or emit light of different wavelengths compared to a light emission wavelength of the LED 4.

Also, the molding unit 7 may have a convex shape or a concave shape. A hemispherical lens (not shown) may be additionally formed on the molding unit 7 flatly formed as described in FIG. 2 to utilize the lens as an additional unit adjusting brightness distribution and an amount of light.

As described above, a plurality of the reflectors are attached to the heat sink 1 and the PCB 5 and the LED 4 is mounted to provide a line light source or a surface light source. Also, the reflector 2 may be used as a back light unit of an LCD instead of cold cathode fluorescent lamps (CCFL).

Reliability of the LED 4 is achieved because heat generated from the LED 4 can be emitted to the heat sink 1 with a shortest distance through the sub mount 9 provided in the mounting region of the LED 4. Also, a manufacturing process of the LED package is simplified because the reflector 2 is simply bonded to the heat sink 1 and the PCB 5.

A weight of the LED package can be reduced because the reflector 2 is formed of plastic materials, but of related art metal materials.

As described above, the present invention provides an LED package fabrication method where the manufacturing process is simplified to reduce manufacturing cost of the LED package.

Also, the weight of the LED package can be reduced using the LED package module including the reflector made of the plastic materials and the LCD back light unit sequentially providing a reflector, a light guide plate, a diffusion sheet, a prism sheet and a protector can be formed on a plurality of the LED package modules using the plurality of the LED package modules.

This invention may, however, be embodied in many different forms and should not be construed as limited to the embodiments set forth herein; rather, these embodiments are provided so that this disclosure will be thorough and complete, and will fully convey the scope of the invention to those skilled in the art.

What is claimed is:

1. A light emission diode package comprising:
   a heat sink having a groove;
   a printed circuit board on the heat sink;
   a light emission diode on the groove;
   a reflector coupled to the heat sink;
   a lead frame included in the reflector and electrically connecting the light emission diode to the printed circuit board; and
   a molding unit on the light emission diode.

2. The light emission diode package according to claim 1, wherein the groove has a protrusion where the light emission diode is mounted thereon.

3. The light emission diode package according to claim 1, wherein the printed circuit board is separated from the groove.

4. The light emission diode package according to claim 1, wherein the reflector is contacted with and coupled to at least one of an upper surface of the heat sink and a side surface and a base surface of the groove formed in the heat sink.

5. The light emission diode package according to claim 1, wherein the reflector is formed of plastic material.

6. The light emission diode package according to claim 1, wherein the reflector has a metal layer on a surface thereof 7. The light emission diode package according to claim 6, wherein the metal layer is coated with phthalocyanine.

8. The light emission diode package according to claim 1, wherein the lead frame is electrically connected to the light emission diode through a wire.

9. The light emission diode package according to claim 1, wherein the lead frame is electrically connected to the printed circuit board through a solder.

10. The light emission diode package according to claim 1, wherein the reflector is vertically or slantly bent at an outer surface.

11. The light emission diode package according to claim 1, wherein the light emission diode is formed on a sub mount.

12. The light emission diode package according to claim 1, wherein the molding unit is formed in a space formed by the reflector.

13. A method of fabricating a light emission diode, the method comprising: preparing a heat sink having a groove and a printed circuit board formed on the heat sink; mounting a light emission diode on a base surface of the groove; coupling a reflector where the lead frame is formed to the heat sink; electrically connecting the lead frame to the light emission diode and the printed circuit board; and forming a molding unit on the light emission diode.

14. The method according to claim 13, wherein, after forming the printed circuit board on the heat sink, the groove is formed by removing portions of the printed circuit board and the heat sink.

15. The method according to claim 13, wherein the reflector is coupled to the heat sink using paste.

16. The method according to claim 13, wherein the mounting of the LED comprises mounting the LED on a sub mount to mount the sub mount on the base surface of the groove.

17. A light emission diode package comprising:
   a heat sink in which a groove is formed by removing a portion thereof;
   a printed circuit board on an upper surface of the heat sink;
   a light emission diode on a base surface of the groove;

a reflector coupled to an upper surface of the heat sink and the groove;

a lead frame passing through the reflector and electrically connecting the light emission diode to the printed circuit board; and a molding unit on the light emission diode.

18. The light emission diode package according to claim 17, wherein the base surface of the groove has a protrusion and the light emission diode is formed on the protrusion.

19. The light emission diode package according to claim 17, wherein the reflector has a portion formed higher than the printed circuit board.

20. The light emission diode package according to claim 17, wherein the light emission diode is formed on a sub mount.

* * * * *